United States Patent [19]
Misra
[11] Patent Number: 5,034,206
[45] Date of Patent: Jul. 23, 1991

[54] ALUMINUM BORATE FIBERS

[75] Inventor: Chanakya Misra, Pittsburgh, Pa.
[73] Assignee: Aluminum Company of America, Pittsburgh, Pa.

[21] Appl. No.: 214,394
[22] Filed: Jul. 1, 1988

Related U.S. Application Data

[62] Division of Ser. No. 912,388, Sep. 26, 1986, Pat. No. 4,789,422.

[51] Int. Cl.[5] ..... C01B 35/12
[52] U.S. Cl. ..... 423/278; 423/277; 423/279; 156/DIG. 61; 156/DIG. 86; 156/DIG. 112
[58] Field of Search ..... 252/315.01, 322; 428/366; 156/621, 624, DIG. 61, DIG. 86, DIG. 108, DIG. 112, 623 R; 423/135, 122, 123, 277, 278, 279, 115, 625; 501/95; 502/202

[56] References Cited

U.S. PATENT DOCUMENTS

| | | | |
|---|---|---|---|
| 2,118,143 | 5/1938 | Benner et al. | 106/9 |
| 3,080,242 | 3/1963 | Benz | 423/277 |
| 3,350,166 | 10/1967 | Alley et al. | 423/279 |
| 3,503,765 | 3/1970 | Blaze, Jr. | 106/65 |
| 3,795,524 | 3/1974 | Sowman | 423/625 |

OTHER PUBLICATIONS

Johnson et al., "Synthesis and Some Properties of Aluminum Borate Whiskers", U.S. Bureau of Mines, 1965, pp. 1-23.

Baumann, Jr., "Electric Furnace Boroaluminate", J. Am. Cer. Soc., vol. 25, No. 14 (1942), pp. 391-394.

*Primary Examiner*—H. M. S. Sneed
*Assistant Examiner*—R. Bruce Breneman
*Attorney, Agent, or Firm*—Andrew Alexander

[57] ABSTRACT

Disclosed is a method of making aluminum borate fibers comprising the steps of preparing an aluminum borate gel by reacting aluminum salt in a solution with ammonium borate and heating the gel to form the aluminum borate fibers.

5 Claims, 1 Drawing Sheet

20kv 1.00kx 10.0P 001

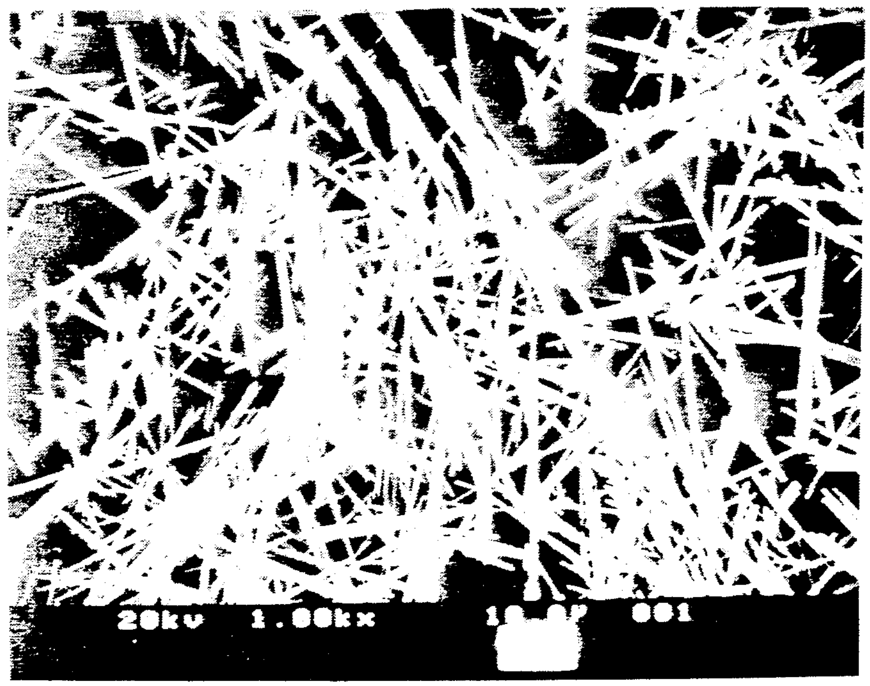
20kv 1.00kx
001

ALUMINUM BORATE FIBERS

This application is a division of application Ser. No. 912,388, filed Sept. 26, 1986, now U.S. Pat. No. 4,789,422.

INTRODUCTION

This invention relates to aluminum borate fibers and more particularly it relates to a method of making aluminum borate whiskers.

Several processes are identified in the art for making aluminum borate whiskers. For example, U.S. Pat. No. 3,350,166 discloses the production of aluminum borate whiskers by reacting together boron oxide vapor, water vapor and aluminum halide vapor. The aluminum halide vapor is selected from aluminum fluoride vapor, aluminum bromide vapor and aluminum chloride vapor.

French Patent Application 2,561,945/A discloses production of an alumina boron oxide catalyst support containing aluminum oxides and boron oxides produced by preparing an alumina gel by hydrolysis of a solution containing aluminum salts or organo-aluminum compounds and a boron oxide precursor. After filtering and washing, the gel is suspended in water and heated to 100° to 300° C. so as to enlarge the majority of the gel particles. The particles are dried and formed into beads, extrusions of equivalent particles and dried and calcined.

In an article by S. P. Mushran in *Current Science,* Volume 15, page 250 (1946) making an aluminum borate gel by adding to 2 cc of aluminum chloride solution to varying amounts of 20% borax soda to provide a volume of 5.55 cc is disclosed. With 2.5 to 2.7 cc borax solution, setting times were about 10 hours, providing a gel which was transparent. 2.8 cc borax solution gave a setting time of 5 hours and an opalescent gel. 3.5 cc borax solution gave an instantaneous set and an opaque gel.

U.S. Pat. No. 3,080,242 discloses a method for the production of fibrous aluminum borate having a new crystal structure. The fibrous aluminum borates are prepared by dissolving alumina or aluminum hydroxide in molten boric oxide at temperatures above 1000° C. The reaction mixture is cooled slowly to below 900° C. According to the patent, the aluminum borate crystallizes in the boric oxide melt in the form of fibers. On cooling further, the boric oxide solidifies to a glass containing the borate fibers dispersed therein.

U.S. Pat. No. 3,795,524 discloses that transparent refractory aggregates and shaped articles such as fibers, films, flakes and microspheres of novel aluminum borate or aluminum borosilicate compositions are made by shaping and dehydratively gelling viscous aqueous boric acid-stabilized aluminum acetate with or without colloidal silica dispersed therein. The resulting gelled body is heated to decompose and volatilize undesired constituents and convert the body to a refractory material useful to form refractory fabrics. The invention also relates to continuous transparent refractory fibers of aluminum borate or aluminum borosilicate, the fibers being useful for composite reinforcement. However, there still remains a great need for an economical process for the production of aluminum borate fibers.

OBJECTS OF THE INVENTION

It is an object of the present invention to provide an economical method for producing aluminum borate fibers.

It is another object of the invention to produce aluminum borate fibers from an aluminum borate gel.

It is yet another object of the invention to produce an aluminum borate gel in an aqueous solution suitable for producing aluminum borate fibers.

These and other objects of the invention will become apparent from a reading of the specification and claims.

SUMMARY OF THE INVENTION

In accordance with these objects, the present invention provides a method of making aluminum borate fibers comprising the steps of preparing an aluminum borate gel by reacting aluminum salt in a solution with ammonium borate and heating the gel to form the aluminum borate fibers.

BRIEF DESCRIPTION OF THE DRAWING

The sole figure shows aluminum borate fibers prepared in accordance with the present invention.

DETAILED DESCRIPTION OF THE PREFERRED EMBODIMENTS

In the present invention, an aluminum-borate gel is formed by reacting an aluminum salt with ammonium diborate in an aqueous solution. Preferably, the aluminum salt is first dissolved in water to provide a solution containing 5 to 25 wt. % of the salt. Also, preferably, the ammonium diborate is provided in solution in a concentration of about 5 to 25 wt. %. For purposes of reaction, both solutions are mixed and reacted at a temperature in the range of 20° to 100° C. Preferably, the reaction is carried out at a temperature in the range of 25° to 45° C.

The aluminum salt concentration is preferably in the range of 8 to 12 wt. %. Also, it is preferred that the ammonium diborate concentration in the solution is in the range of 8 to 12 wt. %. The aluminum salt may be selected from $Al_2(SO_4)_3$, $Al(NO_3)3$, $AlCl_3$ and other aluminum salts which have appreciable solubility in water.

The aluminum salt and ammonium diborate react to form aluminum borate and ammonium salt. The aluminum borate forms the gel which can be about 80% water and the ammonium salt, e.g., $(NH_4)_2SO_4$, formed due to the reaction, is dissolved in the water in the gel. Accordingly, to remove the ammonium salt, the gel can be centrifuged. The centrifuging removes water and the ammonium salt dissolved therein. For more complete removal of the ammonium salt, the gel may be washed several times by dispersion in water if necessary and centrifuged each time to remove the wash water and the ammonium salt contained in it. Filtration of the gel can be substituted for centrifuging.

For purposes of forming aluminum borate fibers, the gel may be heated in an autoclave. This converts the aluminum borate gelatinous material to aluminum borate fibers. The temperature for heating should be in the range of 350° to 500° C., and the pressure of the autoclave should be in the range of 2,000 to 10,000 psig. Preferably, the temperature is in the range of 430° to 460° C., and the pressure is in the range of 4000 to 6000 psig. A typical temperature which has been found useful is 450° C. at 5,000 psig. After the autoclave treatment, the aluminum borate fibers are contained as a slurry of fibers in water. The fibers can be separated from the slurry by filtering and washing with water. The washing can be performed several times, if necessary.

Fibers of aluminum borate produced in accordance with the subject invention have the molar composition $xAl_2O_3.yB_2O_3$ where x is equal to 4 to 9 and y=2 to 5. Typically, x is equal to 9 and y is equal to 2. The aluminum borate fibers produced by this process have a length of about 20 to 200 micrometers and a diameter of 1 to 10 micrometers.

In another aspect of the invention, it has been found that the length of the fibers can be increased. That is, if it is desired to increase the length of the fibers, seed crystals of the same fibers can be added to the aluminum borate gel prior to the autoclaving treatment. The seed crystals then continue to grow upon being subjected to the autoclaving treatment. In addition, on seeding of the gel, aluminum borate whiskers continue to grow as single crystals.

With respect to the aluminumborat gel, it has other uses. That is, the gel can be dehydrated and fired to provide a material, e.g., a granular product useful as an adsorbant. Furthermore, the resultant material may be used as a catalyst support. In addition, the gel may be used as a thickening agent in aqueous based paints or creams, for example, cosmetic creams.

The gel resulting from the reaction has a very high purity, depending to some extent on the amount of washing desired. For example, the gel can have a purity of greater than 99% after washing with levels to above 90 or 95% being easily achieved.

The following examples are further illustrative of the invention.

EXAMPLE 1

Solutions containing 10 wt. % $Al(NO_3)_3$ and 10% $(NH_4)_2B_4O_7$ were prepared by dissolving 10 g each of the respective chemicals in 90 mls each of deionized water. 25 mls of the aluminum nitrate solution was taken in a beaker and 45 mls of the ammonium diborate solution was added slowly along with vigorous mixing. A thick gel formed having a neutral pH of 7. The gel was centrifuged at 2000 rpm for 15 minutes, the clear supernetant squeezed out, the remaining thickened gel remixed with 100 ml water and centrifuged again. This washing procedure was repeated twice. The final washed gel was transferred to a 100 ml capacity autoclave. The closed autoclave was heated to 450° C. and the pressure was maintained at 5000 psig by bleeding off excess steam. The autoclave was maintained at these conditions for a period of 4 hours. The autoclave was then allowed to cool to room temperature and opened. The remaining slurry was filtered and residue on the filter paper washed with hot water. The residue was dried, weighed, examined microscopically and chemically analyzed.

Microscopic observation, shown as a scanning electron microscope photograph in FIG. 1, revealed that the product consists entirely of thin fibers (also called whiskers) of 20 to 200 micrometers length and 1 to 5 micrometers diameter. Chemical analysis of the product showed that it contains only $Al_2O_3$ and $B_2O_3$ in the molar ratio of approximately 9:2. The weight of the final dried product multiplied by the weight percent of aluminum corresponded to 96% of the weight of aluminum contained in 25 mls of 10% $Al(NO_3)3$ solution used in the preparation of the gel. The recovery of aluminum was thus 96%.

EXAMPLE 2

The procedure described in Example 1 was followed to prepare a washed gel. The gel was mixed with 1 g of aluminum borate fibers obtained in Example 1 to serve as seed crystals. The slurry was then transferred to the autoclave and the closed autoclave heated to 445° C. and kept at this temperature for a period of 6 hours. The pressure was held at 5200 psig by bleeding off excess stream. The autoclave was then allowed to cool to room temperature and opened. The product was filtered, washed and dried. Microscopic examination showed that the seed fibers have grown further: a large fraction having a length of 500 to 1500 micrometers and diameter of 2 to 10 micrometers. Chemical analysis and weight of final product corresponded to the conversion of 97% of the starting $Al(NO_3)_3$ to the final aluminum borate product.

While the invention has been described in terms of preferred embodiments, the claims appended hereto are intended to encompass other embodiments which fall within the spirit of the invention.

What is claimed is:

1. Single aluminum borate fibers having the composition $xAl_2O_3.yB_2O_3$ where x is about 9 and y is about 2 the fibers having a length of 100 to 200 micrometers and a diameter of 1 to 10 micrometers, said fibers resulting from an aluminum borate gel formed by the reaction of an aluminum salt and ammonium diborate in an aqueous solution, the gel converted to aluminum borate fibers by heat treatment in a closed autoclave at a pressure in the range of 2,000 to 10,000 psig.

2. The fibers in accordance with claim 1 wherein the gel formation reaction is carried out at a temperature in the range of 20° to 100° C.

3. The fibers in accordance with claim 1 wherein said gel is converted to aluminum borate fibers at a temperature in the range of 350° to 500° C.

4. The fibers in accordance with claim 1 wherein said crystals of aluminum borate are added to said gel for purposes of increasing the size of the fibers.

5. Single crystal aluminum borate fibers having the composition $xAl_2O_3.yB_2O_3$ where x is about 9 and y is about 2 the fibers having a length of 100 to 200 micrometers and a diameter of 1 to 10 micrometers.

* * * * *